United States Patent
McCallum et al.

(10) Patent No.: US 6,352,649 B1
(45) Date of Patent: *Mar. 5, 2002

(54) MATERIAL FOR MAGNETOSTRICTIVE SENSORS AND OTHER APPLICATIONS BASED ON FERRITE MATERIALS

(75) Inventors: R. William McCallum; John E. Snyder; Kevin W. Dennis; Carl R. Schwichtenberg; David C. Jiles, all of Ames, IA (US)

(73) Assignee: Iowa State University Research Foundation Inc., Ames, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/550,454

(22) Filed: Apr. 17, 2000

Related U.S. Application Data

(63) Continuation-in-part of application No. 09/164,981, filed on Oct. 1, 1998, now Pat. No. 6,093,337.

(51) Int. Cl.$^7$ ............................................. C22C 29/12
(52) U.S. Cl. ........................... 252/62.55; 252/62.57; 252/62.62; 252/62.56; 75/234; 75/233; 75/247; 75/246
(58) Field of Search .................... 75/234, 233, 247, 75/246; 252/62.55, 62.59, 62.62, 62.56

(56) References Cited

U.S. PATENT DOCUMENTS

| | | |
|---|---|---|
| 2,754,172 A | 7/1956 | Went et al. |
| 2,951,042 A | 8/1960 | Esveldt et al. |
| 3,502,584 A * | 3/1970 | Denes ...................... 252/62.55 |
| 3,634,742 A | 1/1972 | Edson |
| 3,753,058 A | 8/1973 | Edson |
| 3,882,507 A | 5/1975 | Trimble et al. |
| 3,940,992 A | 3/1976 | Jost et al. |
| 4,033,791 A | 7/1977 | Kaczkowski |
| 4,033,929 A | 7/1977 | Fischbeck et al. |
| 4,068,527 A | 1/1978 | Jost et al. |
| 4,104,549 A | 8/1978 | Akimoto et al. |
| 4,126,723 A | 11/1978 | Huntt |
| 4,151,432 A | 4/1979 | Akimoto et al. |
| 4,170,498 A | 10/1979 | Jost et al. |
| 4,177,438 A | 12/1979 | Vittoria |
| 4,289,987 A | 9/1981 | Russell et al. |
| 4,414,510 A | 11/1983 | Milkovic |
| 4,809,111 A | 2/1989 | Zieren |
| 4,896,544 A | 1/1990 | Garshelis |
| 4,935,263 A | 6/1990 | Satoh et al. |
| 4,960,651 A | 10/1990 | Pettigrew et al. |
| 5,117,321 A | 5/1992 | Nakanishi et al. |
| 5,153,368 A | 10/1992 | Fogle, Jr. |
| 5,302,306 A | 4/1994 | Nagata et al. |
| 5,351,555 A | 10/1994 | Garshelis ............... 73/862.335 |

(List continued on next page.)

OTHER PUBLICATIONS

Allen et al., "The Magneostriction of Magnetic Composite Materials", U.S. DOC Technical report, No. Themis–UND–70–11, 8/70.*

Dieterle, S. "On the Road to Lighter Vehicles," Insider, vol. 11, No. 3, Mar. 2000, pp. 1–2.

Chen et al. "Metal–bonded Co–Ferrite Composites for Magnetostrictive Torque Sensor Applications," IEEE Trans. Magn. 35, 3652 (1999).

Allen et al. "The Magnetostriction of Magnetic Composite Materials," U.S. Department of Commerce Technical Report No. Themis–UND–70–11, Aug. 1970.

*Primary Examiner*—C. Melissa Koslow
(74) *Attorney, Agent, or Firm*—Fitch, Even, Tabin & Flannery

(57) ABSTRACT

The present invention provides magnetostrictive composites that include an oxide ferrite and metallic binders which provides mechanical properties that make the magnetostrictive compositions effective for use as sensors and actuators.

16 Claims, 1 Drawing Sheet

Comparison of magnetostrictions of Co-ferrite composite and Terfenol composite

U.S. PATENT DOCUMENTS

| | | |
|---|---|---|
| 5,421,915 A | 6/1995 | Nakanishi et al. |
| 5,442,966 A | 8/1995 | Hase et al. |
| 5,465,627 A | 11/1995 | Garshelis ............... 73/862.335 |
| 5,520,059 A | 5/1996 | Garshelis ............... 73/862.335 |
| 5,565,830 A | 10/1996 | Sahashi et al. |
| 5,576,912 A | 11/1996 | Mitsumata et al. |
| 5,591,925 A | 1/1997 | Garshelis ............... 73/862.335 |
| 5,650,719 A | 7/1997 | Moody et al. |
| 5,652,394 A | 7/1997 | Sugino et al. |
| 5,694,038 A | 12/1997 | Moody et al. |
| 5,706,572 A | 1/1998 | Garshelis ................... 29/602.1 |
| 5,708,216 A | 1/1998 | Garshelis ............... 73/862.335 |
| 5,729,130 A | 3/1998 | Moody et al. |
| 5,887,335 A | 3/1999 | Garshelis ................... 29/602.1 |
| 6,047,605 A | 4/2000 | Garshelis ............... 73/863.336 |
| 6,093,337 A * | 7/2000 | McCallum et al. ...... 252/62.55 |

\* cited by examiner

Comparison of magnetostrictions of Co-ferrite composite and Terfenol composite

TORQUE TEST OF METAL-BONDED CO-FERRITE COMPOSITE RING
COMPOSITION: 98 vol % $CoO \cdot Fe_2O_3$ + 2 vol % $Ag_{0.97}Ni_{0.03}$

MATERIAL FOR MAGNETOSTRICTIVE SENSORS AND OTHER APPLICATIONS BASED ON FERRITE MATERIALS

CROSS-REFERENCE TO RELATED APPLICATION

The present application is a continuation-in-part application of U.S. Ser. No. 09/164,981, filed Oct. 1, 1998, now U.S. Pat. No. 6,093,337.

STATEMENT REGARDING FEDERALLY SPONSORED RESEARCH

This invention was made with Government support under contract number W-7405-Eng-82 awarded by the Department of Energy. The Government has certain rights in this Invention.

FIELD OF THE INVENTION

The present invention relates to magnetostrictive composites which are effective for use as magnetostrictive sensors and actuators. More particularly, the magnetostrictive composites include metal oxide of the ferrite type and a metallic binder. The metal oxide of the ferrite type and metallic binder provides magnetostrictive and mechanical properties that make the composites effective for use in a wide variety of applications.

BACKGROUND OF THE INVENTION

The magnetic properties of many ferromagnetic materials undergo changes with stress. For example, the magnetic permeability of nickel-iron alloys and iron-cobalt alloys increases and that of nickel decreases with tensile stress. Conversely, if these metals are subject to magnetic fields, their dimensions can change. These magnetostrictive effects, including the Joule effect (change in length when a ferromagnetic rod is placed in a longitudinal field) and the Villari effect (change in magnetization when a magnetized ferromagnetic rod is subjected to longitudinal stress), can be used for converting electrical power to mechanical power and vice versa. Examples of the use of ferromagnetic materials include sensors (U.S. Pat. Nos. 4,414,510 and 5,442,966), transducers (U.S. Pat. No. 3,753,058), and vibrators (U.S. Pat. No. 4,151,432). These types of sensors have low sensitivity ('966 patent) or measure applied magnetic field ('510 patent) rather than stress.

The magnetomechanical effect can be explained in terms of domain processes in magnetostrictive materials. It is known that torsional stresses on a cylinder can be considered to be a biaxial stresses, in which the two stress axes are perpendicular to each other and at 45° to the torsion axis. The stresses along these axes are equal in magnitude but opposite in sign (Sablik et al, *IEEE Tans. Magn.* 35, 498 (1999)). Due to negative magnetostriction, the net magnetization of Co-ferrite composites tends to rotate towards to the compressive stress direction (Garshelis, *IEEE Trans. Magn.* 28, 2202 (1992)).

The stresses have two effects on domain wall motion. From a thermodynamic viewpoint, the effect of the stresses can be considered as an effective magnetic field (Jiles, *J. Phys. D: Appl. Phys.* 28, 1537–1546 (1995)), which induces pressure on 90° domain walls in magnetostrictive materials and leads to domain wall motion. Domain wall motion can be either reversible or irreversible, depending on the strength of the domain wall pinning. If a domain wall is strongly pinned at some points but relatively free to move in-between, application of stress can cause it to bow, much like an elastic membrane. When the stress is removed, it can return to its original position, thus giving reversible behavior. It is the reversible part of the magnetoelastic coupling that determines the sensitivity of the magnetomechanical sensor material. However, if this effective field is strong enough to release a domain wall from a pinning site and move it ahead to another location, the domain wall will not return when the stress is removed, thus causing irreversible changes in magnetization, and hysteresis in the magnetomechanical response. Magnetic anisotropy and local variations of magnetic properties contribute to this hysteretic behavior also. Anisotropy and imperfections in magnetic materials inhibit the changes in magnetization as it attempts to approach the thermodynamic equilibrium state. This causes hysteresis in the present magnetic torque sensor measurement.

The magnetomechanical effect can be discussed in terms of Le Chatelier's principle assuming the process to be reversible. For small reversible changes of magnetization, a thermodynamic relation exists, namely $$\left(\frac{d\lambda}{dH}\right)_\sigma = \left(\frac{dB}{d\sigma}\right)_H$$

where $\lambda$ is the magnetostriction (strain), H is the magnetic field, B is the magnetic induction and $\sigma$ is the stress. Thus, a reversible relationship between magnetostriction and magneto-mechanical effect in response to torsional stress also exists, which has some similarities to the thermodynamic relation. The sensitivity of magnetization to small applied torsional stress (less than 10 N·m) depends on the piezomagnetic coefficient $d_{33}$, $(d\lambda/dH)_o$, rather than the saturation magnetostriction $\lambda_s$. In view of this, a high d coefficient, rather than a high saturation magnetostriction is the critical factor in selecting materials for magnetic torque sensors.

There has been considerable interest in using the magnetomechanical effect in sensors where stress is converted into a change in the magnetization of the magnetostrictive material. Any change in magnetization can be sensed without making contact with the sample. Such a sensor would be ideal for measuring torque in a rotating shaft such as in a drive train or power steering application. There is significant incentive to develop such a torque sensor for power steering applications as the parasitic losses associated with the hydraulic pump in existing power steering systems are relatively large. For example, an electronic based system will result in a five percent decrease in fuel consumption.

Terfenol (commercially available as Terfenol D from Edge Technologies, Ames, Iowa), which is an alloy of terbium, iron and dysprosium, is an excellent magnetostrictive material, however, it has a number of shortcomings. For some applications, Terfenol is not economically viable as a result of the high costs of terbium and dysprosium. Further, in order to obtain optimal results a single crystal is required. As a rare earth transition metal intermetallic, containing high levels of rare earths, Terfenol is extremely brittle and the high content of rare earth metal makes the material extremely susceptible to corrosion.

Other compounds such as nickel and maraging steel have also been considered for use as magnetostrictive sensor material. Nickel has good corrosion resistance and moderate costs, but has only moderate magnetostriction. Maraging steel is lower in cost and has a lower magnetostriction than nickel, but requires carefully controlled heat treatment to produce optimum magnetostriction.

Attempts have been made to use metal oxides of the ferrite type as magnetostrictive vibrators (U.S. Pat. No. 4,151,432). For example, the '432 patent describes a macroscopically homogenous sintered ferrite structure that is $Fe_3O_4$ to $Fe_2O_{4.1}$ either alone or in combination with $Fe_2O_3$. These types of composites have been found to be unsuitable for use in brazing, a technique that could be a preferred method used to attach the sensor material onto a functional component such as a steering or drive shaft.

SUMMARY OF THE INVENTION

The present invention is directed to magnetostrictive composites which are effective for use as magnetostrictive sensors and actuators. The magnetostrictive composites of the invention have excellent corrosion resistance and mechanical properties that make them useful in a number of applications, including their use as sensors in the automotive industry. Further, the magnetostrictive composites of the invention provide economic advantages over other materials used as sensors.

In an important aspect of the invention, the magnetostrictive composites include metal oxide of the ferrite type having a density of at least about 80% of its maximum theoretical density. The metal oxide of the ferrite type of the invention has the general formula $Me_xFe_yO_4$, where Me is Mn, Co, Ti, Zn and mixtures thereof, wherein x is about 0.04 to about 1.3 and y is about 1.7 to about 3.

In another important aspect of the invention, the mechanical properties, the braze-ability, and the sensitivity of the magnetostrictive composites may be improved by blending the metal oxide of the ferrite type with a metallic binder and heating and/or pressing in order to produce a ceramic metallic composite. Metallic binder includes transition metal, silver, or a mixture thereof, and may further include alloys having the general formula $Ag_{1-x}Ni_x$, $Ag_{1-x}Co_y$, where x is about 0 to about 1.0, $Ag_{1-x-y}Ni_xCo_y$, where x+y is about 0 to about 1.0, or binders of the general formula plus other metallic additions which total less than about 50 weight percent. Transition metals useful in the present invention may include Co, Cr, Mn, Fe, Ni, Ti, Cu, Zn and any mixtures thereof.

In this aspect of the invention, the ceramic metallic composite includes a metal oxide of the ferrite type and a metallic binder in amounts which provide a ceramic metallic composite having a density of at least about 70% of its maximum theoretical density. The ceramic metallic composite is effective for providing an amplitude of magnetostriction of at least about 10 to about 400 ppm and is effective for providing a material that has a fracture strength of at least about 10 KSI (kilopounds per square inch).

In a very important aspect of the invention, the volume ratio of metal oxide of the ferrite type to metallic binder can be varied from about 4:1 to about 99:1. The metallic binder does not result in removal of an amount of oxygen from the oxide ferrite ceramic that would degrade or reduce magnetostrictive properties, but acts to wet the ceramic in order to hold the ceramic particles together and to improve the mechanical properties of the material in its solid form. The alloys of the general formula useful in the present invention have a melting point between about 900° C. and about 1400° C. and may include silver/nickel, silver/cobalt, silver/copper/nickel, and silver/copper/zinc/nickel.

In another aspect of the invention, the ceramic metallic composite may further include a hard magnetic powder such as a hard ferrite. Examples of hard ferrites include compounds of the following composition, $$MO+6Fe_2O_3$$

where M is barium, strontium or a combination of the two. In this aspect of the invention, the ceramic metallic composite may include from about 1 to about 50 weight percent hard magnetic powder, based on the weight of the ceramic metallic composite. This serves to provide a magnetic bias field to the magnetostrictive component of the composite.

The present invention further provides a method for producing magnetostrictive composites. In an important aspect of the invention, metal oxides are blended and reacted to form a metal oxide of the ferrite type having a particle size of about 0.01 to about 50 microns. Metal oxides useful in the present invention may include cobalt oxide, iron oxide, manganese oxide, titanium oxide, zinc oxide, and mixtures thereof. The metal oxide of the ferrite type may be blended with a metallic binder that includes transition metals, silver, or a mixture thereof or an alloy having the general formula $Ag_{1-x}Ni_x$, $Ag_{1-x}Co_x$, where x is about 0 to about 1.0, $Ag_{1-x-y}Ni_xCo_y$, where x+y is about 0 to about 1.0, or binders of the general formula plus other metallic additions which total less than about 50 weight percent.

The handling of the resulting part formed from the metal oxide/metallic binder blend may be improved by adding a resin to improve green strength. Resin is burned out at a lower temperature and the green body is then sintered at a temperature of from about 600° C. to about 1200° C. in air for about 1 to about 30 minutes to provide a finished ceramic metallic composite. Resins useful in the present invention include Plenco resin, other commercial binders manufactured for this purpose, and mixtures thereof.

DETAILED DESCRIPTION

Definitions

Figure 1:
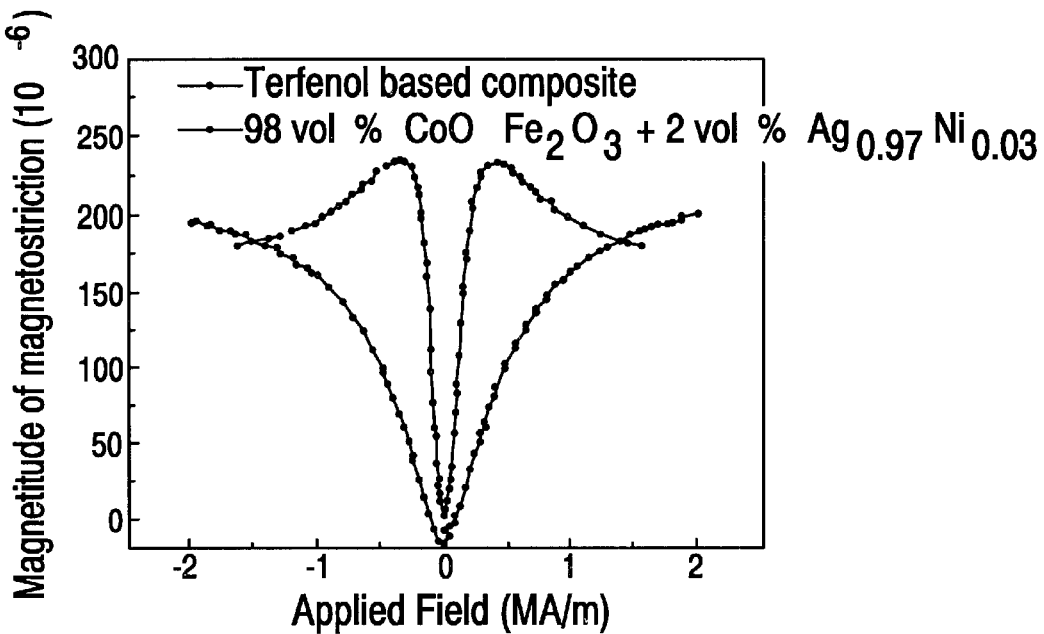
FIG. 1 shows a comparison of magnetostrictions at different field strengths of Co-ferrite composite of 2 vol % $Ag_{0.98}Ni_{0.03}+98$ vol % $CoO.Fe_2O_3$ and a Terfenol based composite (30 vol % Terfenol+70 vol % glass).

As used herein, the terms "magnetostrictive" and "magnetostrictive materials" refer to materials in which the dimensions of the material change when a magnetic field is applied. Typically this is approximately a volume conserving transformation with the dimension along the direction of the applied field either expanding (positive magnetostriction) or contracting (negative magnetostriction). Whether the magnetostriction is positive or negative is not important for this application, but what is important is the "amplitude" of magnetostriction. The dimensions perpendicular to the applied field change in the opposite sense to that along the field so that the volume of the sample is conserved. Alternatively, when a magnetized material is placed under stress, a change in magnetic field results. The resulting change in magnetic field, referred to as a magnetomechanical effect, may be used a sensor in various applications.

As used herein, "maximum theoretical density" refers to a value obtained by averaging the theoretical densities of the component phases based on volume percent. The theoretical density of each component phase is taken to be the x-ray density, that is the density calculated from the crystalline lattice parameters as determined by x-ray diffraction.

As used herein, "fracture strength" refers to a value obtained by using a standard four point bend test as known in the art.

Metal Oxide of the Ferrite Type Compounds

Metal oxide of the ferrite type compounds useful in the present invention include compounds having the general formula $Me_xFe_yO_4$, where Me is Mn, Co, Ti, Zn and mixtures thereof; x is about 0.04 to about 1.3; and y is about 1.7 to about 3. In a very important aspect of the invention, the metal oxide of the ferrite type includes compounds such as $CoFe_2O_4$ (cobalt ferrite), $Co_xFe_yO_4$, $Mn_xFe_yO_4$, $Mn_xCo_{x1}Fe_yO_4$, $Co_xZn_{x1}Fe_yO_4$, $Ti_xFe_yO_4$, and the like, and mixtures thereof, where x and y are defined as indicated above, x1 is about 0 to about 1.2.

In an important aspect of the invention, the metal oxide of the ferrite type compound when used alone provides a density of at least about 80% of its maximum theoretical density or when the metal oxide of the ferrite type is used in combination with a metallic binder, about 70% of its maximum theoretical density. The high density provides the composite with the structural integrity needed to withstand high stress environments that it might be used in. For densities lower than 70%, responses generated by the composites degrade as stress is dissipated in the increased void space.

Metallic Binder

Metallic binders of the present invention include binders selected from the group consisting of transition metal, silver, alloys having the general formula $Ag_{1-x}Ni_x$, $Ag_{1-x}Co_x$, where x is about 0 to about 1.0, $Ag_{1-x-y}Ni_xCo_y$, where x+y is about 0 to about 1.0, binders of the general formula plus other metallic additions which total less than about 50 weight percent, and mixtures thereof.

Metallic binders useful in the present invention include alloys which have a melting point between about 900° C. and about 1400° C. In an important aspect, the metallic binder melts in an oxidizing atmosphere and is capable of wetting a metal oxide of the ferrite type, but at the same time does not undergo extensive chemical reaction with a metal oxide of the ferrite type.

In another aspect of the invention, the metal oxide may be blended with a transition metal, or silver, or a mixture thereof to form an oxide ferrite/transition metal blend. A resin may be blended with the oxide ferrite/transition metal blend. The resulting blend is heated and/or pressed to form a ceramic metallic composite. In this aspect of the invention, the metal oxide may be blended with up to about 20 volume percent, based on the total volume of the composites, of a transition metal, or silver, or a mixture thereof. The transition metal may include Co, Cr, Mn, Fe, Ni, Cu, Zn, Ti and mixtures thereof. This ceramic metallic composite provides improved mechanical properties, improved braze-ability, and improved sensitivity as compared to non-blended oxide ferrite, as the blended oxide ferrite composites yields a very steep slope in terms of magnetostriction vs. applied field. In a very important aspect of the invention, $CoFe_2O_4$ is blended with Co to provide the oxide ferrite/transition metal blend.

Resin

Standard powder processing for pressed and sintered parts utilizes a suitable organic binder (resin) chosen from a wide range of commercially available materials. The organic binder aids in pressing a more uniform green body and enhances the green strength of the pressed part. The organic binder is burned out at low temperature prior to the final high temperature sintering. A typical binder is Plenco resin which is blended with the ferrite/transition metal blend with about 3 to about 5 weight percent resin based on the total composites.

Hard Magnetic Powder

In an alternative aspect of the invention, the ceramic metallic composite may further include a hard magnetic powder. The hard magnetic powder provides an internal bias field, eliminating the need for an externally applied bias field. In this aspect of the invention, from about 1 to about 50 weight percent, based on the weight of the ceramic metallic composite, hard magnetic powder is blended with metallic binder and metal oxide of the ferrite type and optionally the resin, prior to shaping and heating to form the finished ceramic metallic composite.

The following examples illustrate methods for carrying out the invention and should be understood to be illustrative of, but not limiting upon, the scope of the invention which is defined in the appended claims.

EXAMPLES

Example 1

Preparation of Cobalt Ferrite

Commercially available oxides of $Fe_2O_3$ and CoO were mixed in the following weight percentages, 68.063 weight % $Fe_2O_3$ and 31.937 weight % CoO. The mixed oxides were calcined in dry air at about 900° C. for about 2 hours. The calcined mix was then micro milled in a dry nitrogen atmosphere and reannealed in dry air at about 1100° C. for 24 hours. The fired powder was then ground by hand to provide a fine powder.

Example 2

Preparation of Ceramic Metallic Composite

Cobalt ferrite from Example 1 was mixed with metallic binder as indicated in the Table below. After mixing the metallic binder and cobalt ferrite, the powder was cold pressed into a pellet. The cold pressed powder was put into an alumina crucible and the crucible was put into a furnace at about 1450° C. in air for about 10 minutes. The crucible was removed from the furnace and allowed to quench at room temperature.

The magnetostriction was measured on cylindrical samples positioned with the applied magnetic field parallel to the cylindrical axis. A standard commercial strain gauge was glued to the surface of the sample so as to measure strain along the cylindrical axis. A commercial strain gauge meter was used and the field was determined with a commercial Hall probe. Results were as follows.

TABLE 1

| Metallic Binder | Amount of binder/cobalt ferrite (vol %) | Maximum Magnetostriction (PPM) |
| --- | --- | --- |
| 97/3 wt % Ag Ni | 2/98 | −233 |
| 50/50 wt % Ag Ni | 2/98 | −195 |
| 10/90 wt % Ag Ni | 2/98 | −167 |
| Ni | 1/99 | −155 |
| Ni | 2/98 | −75 |
| Ni | 5/95 | −20 |
| Co | 2/98 | −80 to −85 |
| Co | 1/99 | −155 to −200 |
| Ag | 3/97 | −200 |
| Ag | 2/97 | −170 |
| Ag | 1/99 | −175 |

Example 3

Preparation of Co-Ferrite and Metal-Bonded Ferrite Composites

Co-ferrite and metal-bonded ferrite composites were prepared by pressing and sintering as described in Example 2.

Ag/Ni or Ag/Co was used as the metallic constituent in order to bind the ferrite together. Ag, which has a low oxygen affinity, does not reduce the ferrite but the addition of Ni or Co is required in order to cause the metal to wet the ferrite. An important consideration is that the metal bonding improved the mechanical properties of the Co-ferrite.

Magnetostriction was measured as a function of applied magnetic field using strain gauges. The samples were formed into a cylindrical shape with diameters of 4–5 mm and lengths of 10–15 mm. The magnetic field was applied along the cylindrical axis of the samples and the strain was measured in the same direction.

Selected compositions were pressed and sintered in the form of rings that were brazed onto a stainless steel shaft assembly. The magnetic response to torque was measured using a specially designed computer controlled magnetic torque sensor test bed. The test bed provided pure applied torque with no associated bending moment from −10 N·m (counter clockwise) to +10 N·m (clockwise) using a computer-controlled servo motor. All samples were magnetized circumferentially to magnetic remanence. To achieve this, the ferrite rings were rotated in a fringing field which was decreased from 100 kA/m to 0. The changes of external axial magnetic fields, close to the surface at the center of the rings were measured as a function of applied torque.

The maximum magnetostrictions of pure Co-ferrite ($CoO \cdot Fe_2O_3$) and some examples of metal-bonded composites are shown in Table 2. While some of the metal-bonded composites have lower peak magnetostriction than pure $CoO \cdot Fe_2O_3$, they generally offer better mechanical properties and higher slope of magnetostriction $(d\lambda/dH)_o$ at low applied field (H<200 kA/m).

TABLE 2

Magnetostrictions of $CoFe_2O_4$ and various composites bonded with metals

| Composition | Magnetostriction |
|---|---|
| 100% $CoO \cdot Fe_2O_3$ | −225µ |
| 2/98 vol % $Ag_{0.5}Ni_{0.5}$ + $CoO \cdot Fe_2O_3$, | −195µ |
| 2/98 vol % $Ag_{0.8}Ni_{0.2}$ + $CoO \cdot Fe_2O_3$, | −210µ |
| 2/98 vol % $Ag_{0.97}Ni_{0.03}$ + $CoO \cdot Fe_2O_3$ | −225µ |
| 2/98 vol % $Ag_{0.98}Ni_{0.02}$ + $CoO \cdot Fe_2O_3$ | −205µ |

Figure 2:
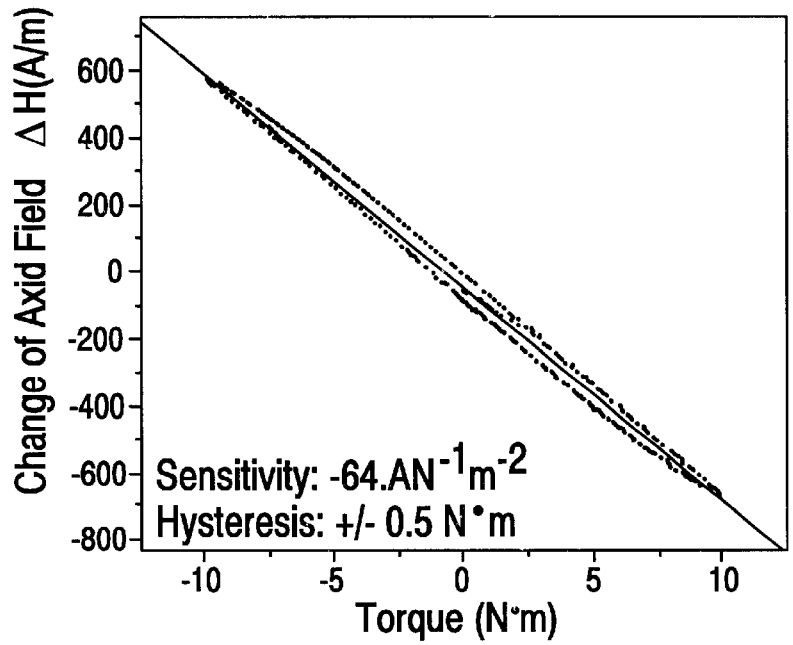
FIG. 2 shows a torque test (change in magnetic field with torque) of metal-bonded Co-ferrite composite ring: 2 vol % $Ag_{0.97}Ni_{0.03}+98$ vol % $CoO.Fe_2O_3$.

A typical result for a metal bonded Co-ferrite torque sensor with a composition of 2 vol % $Ag_{0.97}Ni_{0.03}$+98 vol % $CoO \cdot Fe_2O_3$ is shown in FIG. 2. The magnetomechanical response to applied torque is 64 $AN^{-1}m^{-2}$ with a small hysteresis.

Example 4

Comparison of a Ceramic Metallic Composite with a Terfenol Composite

A typical Co-ferrite composite with a composition of 2/98 vol % $Ag_{0.97}Ni_{0.03}$+$CoO \cdot Fe_2O_3$ is compared with terfenol-based composite in FIG. 1. $CoO \cdot Fe_2O_3$ is known to have a cubic crystal structure with magnetic easy axes along the <100> directions, and $\lambda_{100}$ and $\lambda_{111}$ have opposite signs. Therefore, the measured magnetostriction of the $CoO \cdot Fe_2O_3$ sample peaks at relatively low field (about 300 kA/m), then decreases with increasing field. This behavior contrasts with that of Terfenol-based composites, which only peak at very high-applied fields ($2 \times 10^6$ A/m or larger). Co-ferrite and its metal-bonded composites also have much higher derivatives $(d\lambda/dH)\sigma$ at low applied fields than the Terfenol-based composites.

Example 5

Blending of Oxide Ferrite with Cobalt and Resin $CoFe_2O_4$ was blended with fine cobalt metal (1%) in a ballmill under dry nitrogen. Plenco resin was added to this ceramic/metal blend at 5 weight percent to allow handling of the compacted part. A ring was compacted from this mix then the resin binder was burned in air (5° C./min to 600° C. then furnace cooled) before sintering. Sintering was done in air, 4° C. per minute to 1400° C. then furnace cooled. The ring was fitted to a stainless steel shaft with stainless steel top and bottom support rings. Brazing to the shaft was performed in flowing nitrogen and under static load to ensure contact. The furnace was ramped at 30° C. per minute to 900° C. then rapidly cooled (>200° C. per minute).

Numerous modifications and variations in practice of the invention are expected to occur to those skilled in the art upon consideration of the foregoing detailed description of the invention. Consequently, such modifications and variations are intended to be included within the scope of the following claims.

What is claimed is:

1. A ceramic metallic composite comprising
   a metal oxide of the ferrite type, a metallic binder, and a hard magnetic powder;
   wherein the metallic oxide of the ferrite type has the general formula $Me_xFe_yO_4$, where Me is Mn, Co, Ti, Zn and mixtures thereof, wherein x is about 0.04 to about 1.3 and y is about 1.7 to about 3;
   wherein the metallic binder is selected from the group consisting of transition metal, silver, alloys having the general formula $Ag_{1-x}Ni_x$, $Ag_{1-x}Co_x$, where x is 0 to about 1.0, or $Ag_{1-x-y}Ni_xCo_y$, where x+y is 0 to about 1.0, binders of the general formula plus other metallic additions which total less than about 50 weight percent, and mixtures thereof;
   the ceramic metallic composite having a density of at least about 70% of its maximum theoretical density and an amplitude of magnetostriction of at least about 10 to about 400 ppm, and wherein the ceramic metallic composite has a fracture strength of at least about 10 KSI.

2. A ceramic metallic composite according to claim 1 wherein the ceramic metallic composite includes metallic oxide of the ferrite type and metallic binder in a volume ratio of from about 4:1 to about 99:1.

3. A ceramic metallic composite according to claim 1 wherein the metal oxide of the ferrite type is selected from the group consisting of $CoFe_2O_4$, $Co_xFe_yO_4$, $Mn_xFe_yO_4$, $Mn_xCo_{x1}Fe_yO_4$, $Co_xZn_{x1}Fe_yO_4$, $Ti_xFe_yO_4$, and mixtures thereof, wherein x1 is 0 to about 1.3.

4. A ceramic metallic composite according to claim 1 wherein the composite includes up to about 20 weight percent, based on the weight of the composite, of a metal selected from the group consisting of a transition metal, silver and mixtures thereof.

5. A ceramic metallic composite according to claim 4 wherein the transition metal is selected from the group consisting Co, Cr, Mn, Fe, Ni, Cu, Zn, Ti, and any mixtures thereof.

6. A method for producing a ceramic metallic composite comprising:
   blending and reacting metal oxides to form a metal oxide of the ferrite type having a particle size of about 0.01 to about 50 microns;
   blending a metallic binder and a resin with the metal oxide of the ferrite type;

forming the metallic binder and metal oxide of the ferrite type into a desired shape;

heating the shaped blend in air at about 600° C. to about 1200° C. for about 1 to about 30 minutes to provide a finished ceramic metallic composite.

7. A method for producing a ceramic metallic composite according to claim 6 wherein the metal oxide of the ferrite type has the general formula $Me_xFe_yO_4$, where Me is Mn, Co, Ti, Zn and mixtures thereof, wherein x is about 0.04 to about 1.3 and y is about 1.7 to about 3.

8. A method for producing a ceramic metallic composite according to claim 7 wherein the metal oxide of the ferrite type is selected from the group consisting of $CoFe_2O_4$, $Co_xFe_yO_4$, $Mn_xFe_yO_4$, $Mn_xCo_{x1}Fe_yO_4$, $Co_xZn_{x1}Fe_yO_4$, $Ti_xFe_yO_4$, and mixtures thereof, wherein x1 is 0 to about 1.2.

9. A method for producing a ceramic metallic composite according to claim 6 wherein the metallic binder is selected from the group consisting of transition metal, silver, alloys having the general formula $Ag_{1-x}Ni_x$, $Ag_{1-x}Co_x$, where x is 0 to about 1.0, or $Ag_{1-x-y}Ni_xCo_y$, where x+y is 0 to about 1.0, binders of the general formula plus other metallic additions which total less than about 50 weight percent, and mixtures thereof.

10. A method for producing a ceramic metallic composite according to claim 6 wherein the composite includes up to about 20 weight percent, based on the weight of the composite, of a transition metal selected from the group consisting Co, Mn, Fe, Ti, Ag, and any mixtures thereof.

11. A method for producing a ceramic metallic composite according to claim 6 wherein the ceramic metallic composite has a density of at least about 70% of its maximum theoretical density and an amplitude of magnetostriction of at least about 10 to about 400 ppm, and wherein the ceramic metallic composite has a fracture strength of at least about 10 KSI.

12. A method for producing a ceramic metallic composite according to claim 6 wherein the composite includes from about 3 to about 5 weight percent, based on the, weight of the composite, of a resin.

13. A method for producing a ceramic metallic composite according to claim 6 wherein the method further comprises blending a hard magnetic powder with the metallic binder and metal oxide of the ferrite type.

14. A method for producing a ceramic metallic composite according to claim 13 wherein from about 1 to about 50 weight percent hard magnetic powder, based on the weight of the ceramic metallic composite, is blended with the metallic binder and metal oxide of the ferrite type.

15. A method for producing a ceramic metallic composite according to claim 6 wherein the method further comprises blending a hard magnetic powder with the metallic binder and metal oxide of the ferrite type.

16. A method for producing a ceramic metallic composite according to claim 15 wherein from about 1 to about 50 weight percent hard magnetic powder, based on the weight of the ceramic metallic composite, is blended with the metallic binder and metal oxide of the ferrite type.

* * * * *